(12) United States Patent  (10) Patent No.: US 8,933,833 B2
Yasuda et al.  (45) Date of Patent: Jan. 13, 2015

(54) CONVERSION DEVICE

(75) Inventors: Akira Yasuda, Tokyo (JP); Jun-ichi Okamura, Kawasaki (JP)

(73) Assignee: Trigence Semiconductor, Inc., Tokyo (JP)

( * ) Notice: Subject to any disclaimer, the term of this patent is extended or adjusted under 35 U.S.C. 154(b) by 262 days.

(21) Appl. No.: 13/552,270

(22) Filed: Jul. 18, 2012

(65) Prior Publication Data

US 2013/0093607 A1  Apr. 18, 2013

Related U.S. Application Data

(63) Continuation of application No. PCT/JP2011/050813, filed on Jan. 19, 2011.

(30) Foreign Application Priority Data

Jan. 19, 2010  (JP) .................................. 2010-009318
Jan. 19, 2011  (JP) .................................. 2011-008397

(51) Int. Cl.
  *H03M 1/12*  (2006.01)
  *H03M 9/00*  (2006.01)
  *H03M 3/00*  (2006.01)

(52) U.S. Cl.
  CPC ............... *H03M 9/00* (2013.01); *H03M 3/466* (2013.01)
  USPC ............ 341/155; 341/143; 341/100; 341/101

(58) Field of Classification Search
  CPC .............................. H03M 3/466; H03M 9/00
  USPC .................... 341/143, 155, 100, 101
  See application file for complete search history.

(56) References Cited

U.S. PATENT DOCUMENTS 6,930,625 B1 *  8/2005  Lin ............................... 341/143
7,098,828 B2 *  8/2006  San et al. ...................... 341/143

(Continued)

FOREIGN PATENT DOCUMENTS

JP  2004-007702  1/2004
JP  2006-013705  1/2006
WO  WO 2007/135928  11/2007

OTHER PUBLICATIONS

Vincenzo Ferragina et al., "Gain and Offset Mismatch Calibration in Time-Interleaved Multipath A/D Sigma-Delta Modulators", IEEE Transactions on Circuits and Systems-I Regular Papers, vol. 51, No. 12, Dec. 2004, pp. 2635-2373.

(Continued)

*Primary Examiner* — Jean B Jeanglaude

(57) ABSTRACT

The disclosed conversion device converts an analog input signal into a digital signal and outputs thereof, wherein the conversion device comprises a feedback signal generator for performing mismatch shaping on the digital signal that has been converted and output, and then performing digital-analog conversion to generate a feedback signal; a subtractor for subtracting the feedback signal from the analog input signal and outputting thereof; a serial-parallel converter for converting the signal output from the subtractor into a plurality of parallel signals and outputting thereof; a vector filter for performing signal processing on the plurality of parallel signals output by the serial-parallel converter and outputting a plurality of signals; a quantizer for quantizing the plurality of signals output by the vector filter and outputting digital signals; and a parallel-serial converter for converting the digital signals output by the quantizer into serial signals and outputting thereof.

4 Claims, 19 Drawing Sheets

(56) References Cited

U.S. PATENT DOCUMENTS

| | | |
|---|---|---|
| 2003/0222805 A1 | 12/2003 | Ying et al. |
| 2005/0285766 A1 | 12/2005 | San et al. |
| 2009/0110217 A1 | 4/2009 | Yasuda et al. |

OTHER PUBLICATIONS

International Search Report of Corresponding PCT Application PCT/JP2011/050813 mailed Apr. 19, 2011.

* cited by examiner

CONVERSION DEVICE

CROSS REFERENCE TO RELATED APPLICATIONS

This application is a continuation application under 35 U.S.C. §111(a), of International Application PCT/JP2011/050813 filed Jan. 19, 2011, designating the U.S., in which the International Application claims the priority benefit of Japanese Patent Application No. 2010-009318 filed Jan. 19, 2010 and Japanese Patent Application No. 2011-008397 filed Jan. 19, 2011, in the Japanese Intellectual Property Office, the entire contents of which are incorporated herein by reference.

FIELD OF THE INVENTION

The present invention is related to a conversion device which converts an analog signal into a digital signal and a conversion device which converts a digital signal into an analog signal. In particular, the present invention is related to an analog-digital conversion device and a digital-analog conversion device which use a ΔΣ modulator.

DESCRIPTION OF THE RELATED ART

A method which uses a ΔΣ modulator shown in FIG. 1 for example is used as a method of realizing a highly accurate analog-digital convertor and a highly accurate digital-analog convertor. In a method which uses a ΔΣ modulator an input signal which is passed through a loop filter is initially quantized with a lower resolution than the accuracy which is finally demanded and a feedback process is performed on this result to an input. In addition, an oversampling process is performed with a higher sampling frequency than the sampling frequency which is finally required. By performing a feedback process, a frequency distribution of quantization noise, which is generated by low resolution quantization, is controlled by the over sampled high sampling frequency, and the noise within a signal band is reduced. This type of method is called a noise shaping. By using a noise shaping, it is possible to obtain a high conversion accuracy even in the case where a low resolution quantizer is used. It is possible to reduce the noise within a signal band by increasing the ratio between the sampling frequency which is finally required and the oversampled sampling frequency (oversampling ratio).

Therefore, it is necessary to increase the oversampling ratio in the case of obtaining a high conversion accuracy or a high signal to noise ratio (SNR). For example, it is necessary to increase the oversampling sampling frequency by about 100 times that of an output sampling frequency.

A method which operates in parallel a plurality of ΔΣ modulators as is shown in FIG. 2 is known as a method of solving this problem. In this method, it is possible to reduce the operation speed of a circuit by the number of parallel modulators. However, circuit scale becomes larger in proportion to the number of parallel operating modulators. In addition, overall modulation accuracy deteriorates significantly in the case where there is a mismatch in characteristics within circuits operated in parallel.

PRIOR TECHNICAL DOCUMENT

Non-Patent Document

Vincenzo Ferragina, etc., "Gain and Offset Mismatch Calibration Time-Interleaved Multipath A/D Sigma Delta Modulators," IEEE TRANSACTIONS ON CIRCUITS AND SYSTEMS I, Vol. 51, No. 12, pp. 2635-2373, DECEMBER 2004.

SUMMARY OF THE INVENTION

Problem to be Solved

As stated above, in the conventional method there is a tradeoff relationship between a conversion accuracy and a sampling frequency. Therefore, in order to obtain a high conversion accuracy it is necessary to perform sampling at a substantially high sampling frequency and to operate the circuits which form a convertor at a high speed.

On the other hand, while it is possible to reduce the operation speed of a circuit by the number of parallel modulators in the case of operating in parallel a plurality of ΔΣ modulators, circuit scale increases in proportion to the number of ΔΣ modulators which are operated in parallel, which is a problem. In addition, overall modulation accuracy deteriorates significantly in the case where there is a mismatch in characteristics within circuits operating in parallel, which is also a problem.

The present invention remedies these problems and unlike the case of operating circuits in parallel, aims to control the increase in circuit scale, to reduce the demand on a gain variable means and furthermore to provide an analog-digital convertor and a digital-analog convertor which reduce the influence of a mismatch between circuits.

Means for Solving the Problem

As one embodiment of the present invention a conversion device is disclosed in which an input signal is divided into a plurality of vector signals, a vector filter process is performed on these vector signals and the result is selectively quantized, and fed back to the input stage. In this way, it is possible to reduce circuit scale by M times or less while reducing an internal signal process speed to 1/M (M is a natural number).

As one embodiment of the present invention, a conversion device is disclosed in which an input signal is down sampled after signal processing and the down sampled signal is divided into a plurality of vector signals, a vector filter process is performed on these vector signals and the result is selectively quantized, and fed back to the input stage. In this way, it is possible to reduce circuit scale by M times or less while reducing an internal signal process speed to 1/M (M is a natural number).

As one embodiment of the present invention, a conversion device which converts an analog input signal to a digital signal and outputs the digital signal is disclosed including a feedback signal generator which performs digital-analog conversion after mismatch shaping the digital signal, which is converted and output by the conversion device, and generates a feedback signal, a subtractor which subtracts the feedback signal from the analog input signal and outputs the analog input signal, which is subtracted, a serial-parallel converter which converts a signal output from the subtractor to a plurality of parallel signals and outputs the plurality of parallel signals, a vector filter which performs signal processing on the plurality of parallel signals output from the serial-parallel converter and outputs the plurality of signals, and a quantizer which quantizes a signal output from the vector converter and outputs the digital signal.

As one embodiment of the present invention, a conversion device which converts an analog input signal to a digital signal and outputs the digital signal is disclosed including a feedback signal generator which performs digital-analog conversion after mismatch shaping the digital signal, which is converted and output by the conversion device, and generates a feedback signal, a subtractor which subtracts the feedback signal from the analog input signal and outputs the analog input signal, which is subtracted, a serial-parallel converter which converts a signal output from the subtractor to a plurality of parallel signals and outputs the plurality of parallel signals, a vector filter which performs signal processing on the plurality of signals output from the serial-parallel converter and outputs the plurality of signals, a vector converter which performs vector conversion on the plurality of signals output by the vector filter and outputs a plurality of signals, a quantizer which quantizes the plurality of signals output from the vector filter and outputs a digital signal, a reverse vector converter which performs a reverse conversion of the vector conversion performed by the vector converter on the digital signal output by the quantizer and outputs a digital signal, and a parallel-serial converter which converts the digital signal output by the reverse vector convertor to a serial signal and outputs the serial signal.

As one embodiment of the present invention, a conversion device which converts an analog input signal to a digital signal and outputs the digital signal is disclosed including a feedback signal generator which performs digital-analog conversion after mismatch shaping the digital signal, which is converted and output by the conversion device and generates a feedback signal, a subtractor which subtracts the feedback signal from the analog input signal and outputs the analog input signal, which is subtracted, a serial-parallel converter which inputs a signal output from the subtractor to a circuit in which a plurality of delay circuits are connected in series, down samples the analog input signal and each output signal from the plurality of delay circuits to convert to a plurality of parallel signals and outputs the plurality of parallel signals, a vector filter which performs signal processing on the plurality of parallel signals output from the serial-parallel converter and outputs a plurality of signals, a vector converter which inputs the plurality of parallel signals output by the serial-parallel converter to a cross-coupling circuit, inputs an output of the cross-coupling circuit to an integrator and outputs a sum of an output of the integrator, and a quantizer which quantizes the signal output from the vector converter and outputs the digital signal.

As one embodiment of the present invention, a conversion device which converts an analog input signal to a digital signal and outputs the digital signal is disclosed a including a feedback signal generator which performs digital-analog conversion after mismatch shaping the digital signal, which is converted and output by the conversion device and generates a feedback signal, a subtractor which subtracts the feedback signal from the analog input signal and outputs the analog input signal, which is subtracted, a serial-parallel converter which inputs a signal output from the subtractor to a circuit in which a plurality of delay circuits are connected in series, down samples the analog input signal and each output signal from the plurality of delay circuits to convert to a plurality of parallel signals and outputs the plurality of parallel signals, a vector filter which performs signal processing on the plurality of parallel signals output from the serial-parallel converter and outputs a plurality of signals, a vector converter which inputs the plurality of parallel signals output by the serial-parallel converter to a cross-coupling circuit, inputs an output of the cross-coupling circuit to an integrator and outputs an output of the integrator, and a quantizer which quantizes a signal output from the vector converter and outputs the digital signal.

As one embodiment of the present invention, a conversion device which converts an analog input signal to a digital signal and outputs the digital signal is disclosed including a feedback signal generator which performs digital-analog conversion after mismatch shaping the digital signal, which is converted and output by the conversion device, and generates a feedback signal, a serial-parallel converter which converts the analog input signal to a plurality of parallel signals and output the plurality of parallel signals, a subtractor which subtracts the feedback signal from each of the plurality of parallel signals output by the serial-parallel converter and outputs a plurality of parallel signals, a vector filter which performs signal processing on the plurality of parallel signals output from the subtractor and outputs a parallel signal, and a quantizer which quantizes a signal output from the vector filter and outputs the digital signal.

Advantage of the Present Invention

According to embodiments of the present invention, it is possible to reduce the mismatch effects between filters and quantizers operating in parallel, and to reduce circuit scale unlike in the case of operating a plurality of $\Delta\Sigma$ modulators in parallel. In this way, it is possible to operate at a lower sampling frequency, that is, a lower over sampling ratio than a conventional $\Delta\Sigma$ modulator type analog-digital convertor and digital-analog converter, and to realize higher conversion accuracy with a smaller circuit scale.

DETAILED DESCRIPTION OF THE INVENTION

Figure 1:
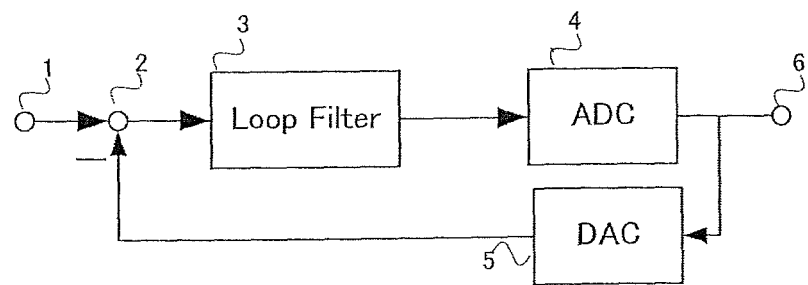
FIG. 1 is an exemplary diagram of conventional structures of an analog-digital converter and a digital-analog converter.
Figure 2:
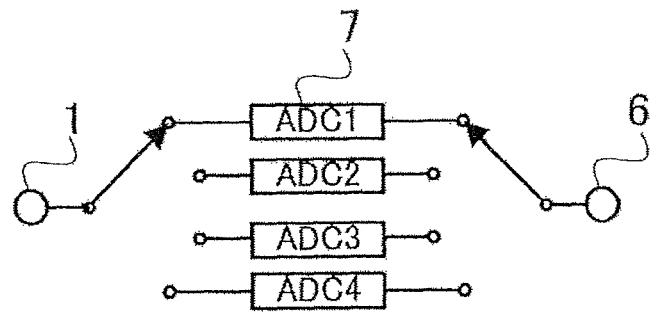
FIG. 2 is an exemplary view of a parallel operation of a plurality of $\Delta\Sigma$ modulators.

The present invention is explained in detail below as a number of embodiments while referring to the drawings. Furthermore, the present invention is not limited to the embodiments and can be realized by performing various modifications as long as they do not depart from the scope of the invention.

Figure 3:
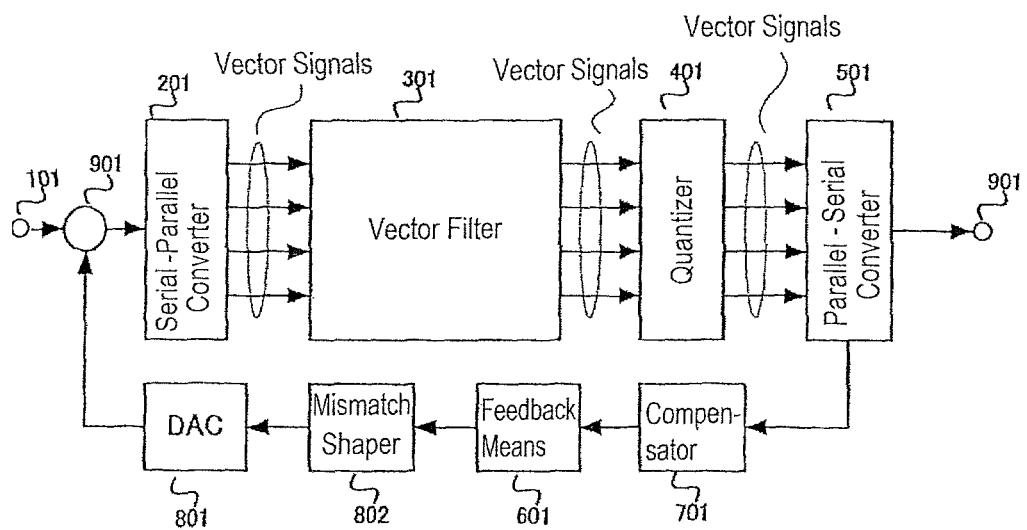
FIG. 3 is a functional block diagram of a conversion device related to one embodiment of the present invention.

A functional block diagram of a conversion device related to a first embodiment of the present invention is shown in FIG. 3. A feedback signal from a digital-analog converter (DAC) (801) is subtracted using a subtractor (901) from an input signal input by an input means (101). The subtracted signal is input to a serial parallel converter (201). In other words, the subtractor (901) is arranged before the serial parallel converter (201). The signal which is converted by the serial parallel converter (201) is input to a vector filter (301). The signal which is processed by the vector filter (301) is quantized by a quantizer (401). The quantized signal is again converted to a serial signal by a parallel serial converter (401). In addition, the signal is fed back to the input means (101) via a DAC (801) by a feedback means (601).

In a conventional method a feedback signal is fed back to a stage prior to the vector filter. As a result, overall conversion characteristics are determined by elements such as a serial parallel converter, a vector filter, etc., and by a mismatch of the coefficients etc. Consequently, the conversion accuracy deteriorates significantly. In the present embodiment, by returning a feedback signal to the subtractor (901), which is arranged before the serial parallel converter (201), it is possible to realize an accurate conversion even in the case where the above mentioned mismatch exists As is generally known, in the case of using this type of a feedback type analog-digital converter, conversion accuracy equivalent to a final accuracy is demanded for the digital-analog converter (801). Thus, in the present embodiment, an oversampling procedure is used, and a mismatch shaper (802) is arranged before the digital-analog converter (801). In this way, the demands on this conversion accuracy can be relaxed and it is possible to improve the final SNR within a conversion band. The output of the parallel serial converter (501) is externally output as a result of analog-digital conversion. In addition, it is also possible to output the output of the quantizer (401) as the output of the converter as a result. In this case, it is possible to use a plurality of digital outputs can be used as they are in a subsequent digital signal process.

Figure 4:
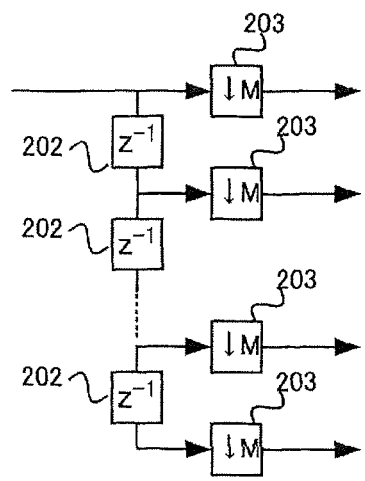
FIG. 4 is an exemplary functional block diagram of a serial parallel converter used in a conversion device related to one embodiment of the present invention.

FIG. 4 shows a detailed block diagram of a serial parallel converter which can be used in a conversion device related to the present embodiment. An input signal input to the serial parallel converter is input to a circuit in which a plurality of delay devices (202) is connected in series. The input signal and each of the outputs of the plurality of delay devices (202) are down sampled by a down sampling device (203) and output as an output of the serial parallel converter as the vector (parallel) signal shown in the diagram. The vector signal, which is comprised of the plurality of signals, is input to the vector filter (301).

Figure 5:
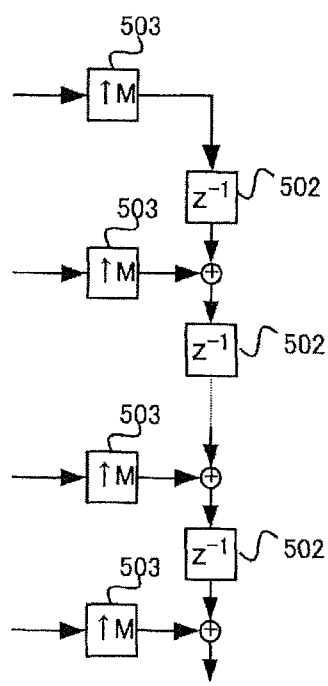
FIG. 5 is an exemplary functional block diagram of a parallel serial converter used in a conversion device related to one embodiment of the present invention.

FIG. 5 shows a detailed block diagram of a parallel serial converter which can be used in a conversion device related to the present embodiment. An input signal input to the parallel serial converter is input to each up sampling device (503) respectively. The input signal is over sampled M times by up sampling using the up sampling devices (503). The up sampled signals input simultaneously to the plurality of up sampling devices (503) are converted to serial data using a plurality of delay devices (502) arranged after each of the up sampling devices. At this time, the output sampling frequency of the parallel serial converter becomes a sampling frequency M times that of the sampling frequency in the vector filter and the quantizer.

Figures 6, 7:
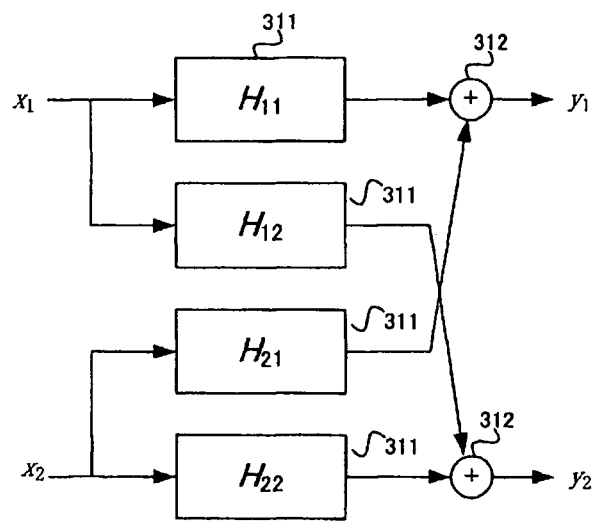
FIG. 6 is an exemplary diagram of a transfer function of a vector filter used in a conversion device related to one embodiment of the present invention.
FIG. 7 is an exemplary diagram of a structure of a vector filter used in a conversion device related to an embodiment of the present invention.

The vector filter (301) performs signal processing on the parallel signal which is output by the serial parallel converter (201). In the present embodiment, the vector filter (301) is not limited to a filter which simply operates on each element (each signal) of a vector signal individually. That is, the vector filter (301) may also operate on a plurality of vector elements (signals). The function of the vector filter (301) can also be expressed as a matrix which operates on a vector which expresses a vector signal for example. An example of a vector transfer function is shown in FIG. 6. The transfer function is expressed using a transfer function with respect to each element of a vector. The output of the vector filter can be expresses as a sum calculated using a transfer function with respect to each element as is shown in FIG. 6.

Therefore, in the case where this type of a transfer function is realized in an electronic circuit etc, there is a device which operates on each element of the vector signal and a device which operates between each output. In this way, even in the case where there is an error such as a mismatch etc. in the vector filter due to signal processing, in the present embodiment it is possible to disperse these effects and realize highly accurate conversion by using a mismatch shaper (802).

Usually, a vector filter is realized using a discrete-time circuit. In the present embodiment, it is also possible to realize the vector filter (301) using a discrete-time circuit. In addition, in the present embodiment, it is also possible to realize a vector filter using a continuous-time circuit. In this case it becomes easier to improve circuit operation speed compared to a discrete-time circuit and it is possible to reduce current consumption.

A specific block diagram of the structure of a vector filter in the case where there are 2 vector elements is shown in FIG. 7. Input signals are given as $x_1$, $x_2$ and output signals are given as $y_1$, $y_2$. Transfer functions $H_{11}$, $H_{21}$ of a filter means (311) operate on $x_1$, and $H_{12}$, $H_{22}$ operate on $x_2$. In this way, $y_1 = H_{11} x_1 + H_{21} x_2$ and $y_2 = H_{12} x_1 + H_2 x_2$.

Figure 8:
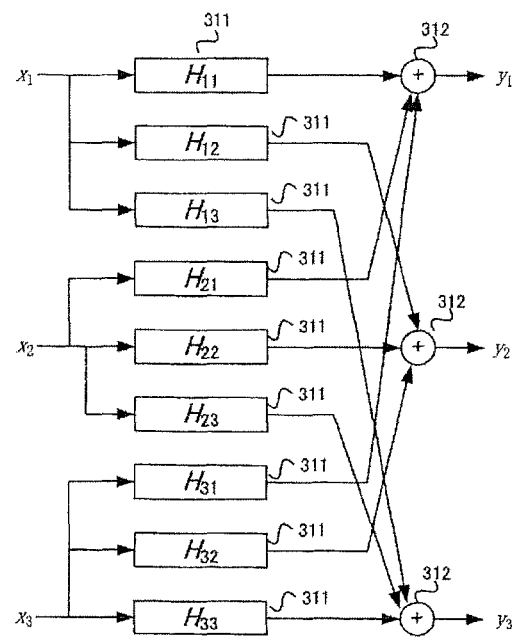
FIG. 8 is an exemplary diagram of a structure of a three dimensional vector filter used in a conversion device related to an embodiment of the present invention.

A specific block diagram of the structure of a vector filter in the case where there are 3 vector elements is shown in FIG. 8. In this case also, the same as in the case where there are 2 vector elements, transfer functions of each filter means (311) operates on inputs $x_1$, $x_2$, $x_3$ respectively.

Figure 9:
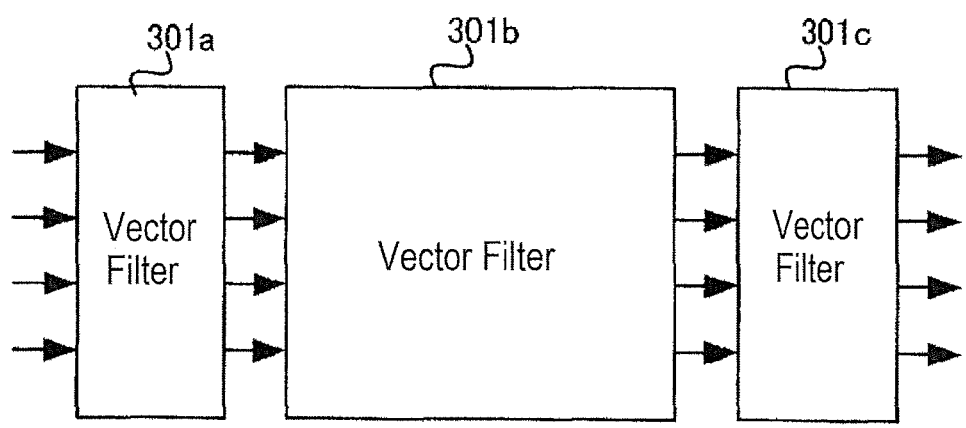
FIG. 9 is an exemplary diagram of a structure of a multi-stage vector filter used in a conversion device related to an embodiment of the present invention.

As a conversion device related to a second embodiment of the present invention, a conversion device is explained such that any one of the conversion devices explained thus far includes multi-stage connected vector filters. An example of the structure of a vector filter which can be used in a conversion device related to the second embodiment of the present invention is shown in FIG. 9. That is, the structure of a multi-stage connected vector filter is shown in FIG. 9. In the present embodiment, the vector filter in the first embodiment is formed using multi-stage vector filters (301a, 301b, 301c). With this type of structure it becomes easy to perform a plurality of processes. In the case of realizing a vector filter using an electronic circuit etc., in the case where the order of each filter is first order or second order, it is easy to realize a vector filter as a circuit. Therefore, it is preferred to form each element of the vector filters shown in FIG. 6, FIG. 7, and FIG. 8 as first order or second order. However, in the case where each element of a vector filter is formed as first order or second order, the order of the vector filter becomes restricted to first order or second order. Thus, in the present embodiment, it is possible to solve this problem by connecting first order or second order vector filter in multi-stages.

Figure 10:
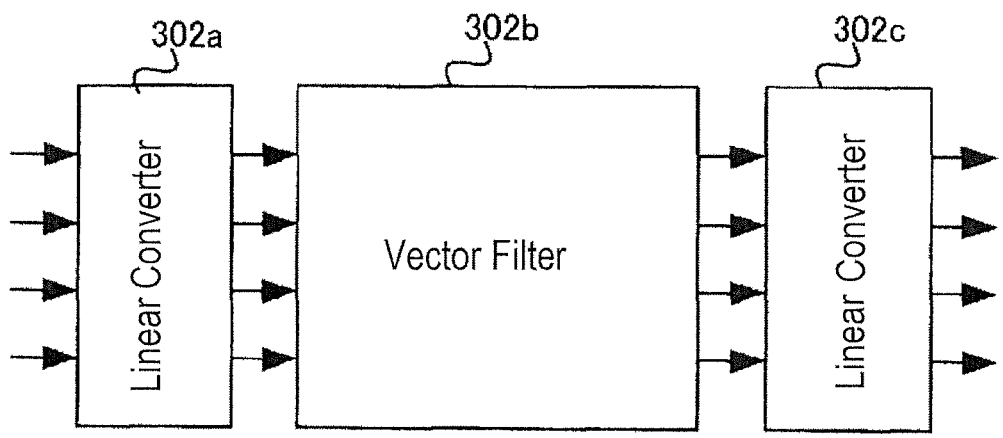
FIG. 10 is an exemplary functional block diagram of a vector filter using a linear converter used in a conversion device related to one embodiment of the present invention.

As a conversion device related to a third embodiment of the present invention, a conversion device is explained such that any of the conversion devices explained thus far includes vector filters which perform linear conversion. A functional block diagram of a vector filter which can be used in a conversion device related to the third embodiment of the present invention is shown in FIG. 10. In the present invention a vector filter which uses a linear conversion is used as the vector filter. In the present embodiment, the vector filter (301) is formed using a linear converter (302a), an internal vector filter (302b), and a linear converter (302c). The linear converter (302a) performs a calculation with respect to the components of an input vector signal. A calculation which takes the differences of each element and a calculation which takes the sum of each element are examples of the linear conversion. This linear conversion converts the components of each vector. Thus this linear conversion is called a vector conversion. It is also possible to use coordinate conversion in vector conversion.

Using this type of conversion, vector signals are mixed by calculation (addition for example). By sharing the effects of errors produced by variations between elements which realize the structural elements of the serial parallel converter (201), it is possible to relax these effects. This linear conversion can also be performed by the converter (302c) connected to the internal vector filter. In addition, a linear conversion can also be realized by either one of or both the vector filter (302b) and the converter (302c).

Figure 11:
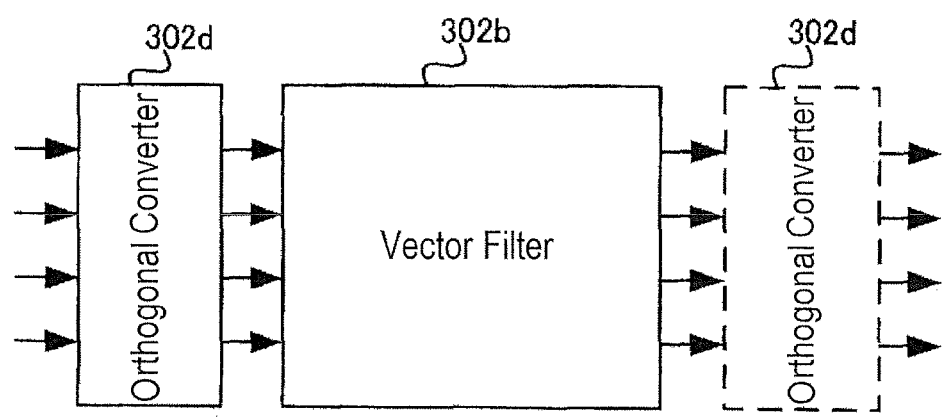
FIG. 11 is an exemplary functional block diagram of a vector filter using orthogonal conversion used in a conversion device related to one embodiment of the present invention.

As a conversion device related to a fourth embodiment of the present invention, a conversion device is explained such that any one of the conversion devices explained thus far includes vector filters which perform orthogonal conversion. A functional block diagram of a vector filter which can be used in a conversion device related to the fourth embodiment of the present invention is shown in FIG. 11. In the present embodiment, an orthogonal conversion is used as a vector filter. An input vector signal is converted to a different vector signal using an orthogonal converter (302d). It is possible to perform a conversion without reducing the amount of data held in an input vector signal by using an orthogonal conversion. In other words, it is possible to conversion all of the data held in an input vector signal.

Generally, in an analog-digital converter, an accurate conversion of an input signal from an analog signal to a digital signal is demanded. That is, it is demanded that the reduction of the amount of data held in an input signal be as small as possible. By using the orthogonal converter (302d) it is possible to convert all of the data of a vector signal which is input. In addition, by performing the reverse conversion of an orthogonal conversion by the orthogonal converter (302d), it is possible to completely restore the input vector signal to its original state. By using this type of conversion in a vector filter it is possible to reduce the effects of errors due to variation as mentioned above and accurately convert an input signal. It is also possible to insert the orthogonal converter into any of the positions within the loop shown in FIG. 3 or other drawings. In addition, it is also possible to insert the orthogonal converter into any of the positions outside of the loop shown in FIG. 3 or other drawings.

It is also possible use a Fourier conversion, a discrete-cosine conversion or a wavelet conversion as an orthogonal conversion of the present embodiment.

Figure 12:
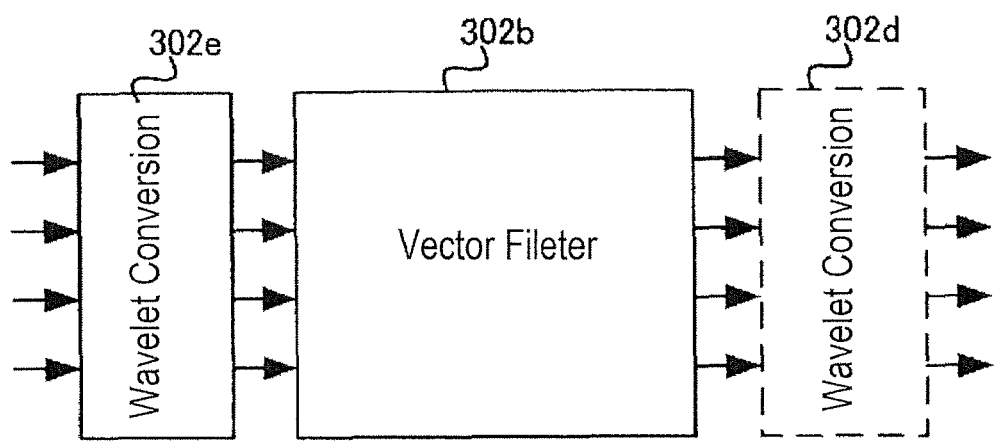
FIG. 12 is an exemplary diagram of a structure of a vector filter using wavelet conversion used in a conversion device related to one embodiment of the present invention.

As a conversion device related to a fifth embodiment of the present invention, a conversion device is explained such that any one of the conversion devices explained thus far includes vector filters which perform a wavelet conversion. A functional block diagram of a vector filter which can be used in the conversion device related to the fifth embodiment of the present invention is shown in FIG. 12. The present embodiment is characterized by using a wavelet conversion as a linear conversion. An input signal which is input is converted to different signal using a wavelet converter (302e). It is possible to perform conversion without losing all of the data held in an input vector signal by using an orthogonal conversion in this conversion process. In addition, by using a wavelet conversion it is possible to lower time resolution in a conversion to low frequency components and to increase time resolution in a conversion to high frequency components when converting a vector signal. Generally, time resolution with respect to low frequency components may be low and time resolution should be high with respect to high frequency components. As is shown in the present embodiment, by using a wavelet converter signal processing according to the frequency components of a signal input to an analog-digital conversion device becomes possible and it becomes possible to efficiently improve the accuracy of an analog-digital conversion.

In addition, a wavelet converter can be arranged after the internal vector filter (302b). As another embodiment, it is possible to obtain an output which does not perform vector conversion as the entire vector filter by arranging a wavelet converter and a reverse wavelet converter before or after the internal vector filter (302b).

Figure 13:
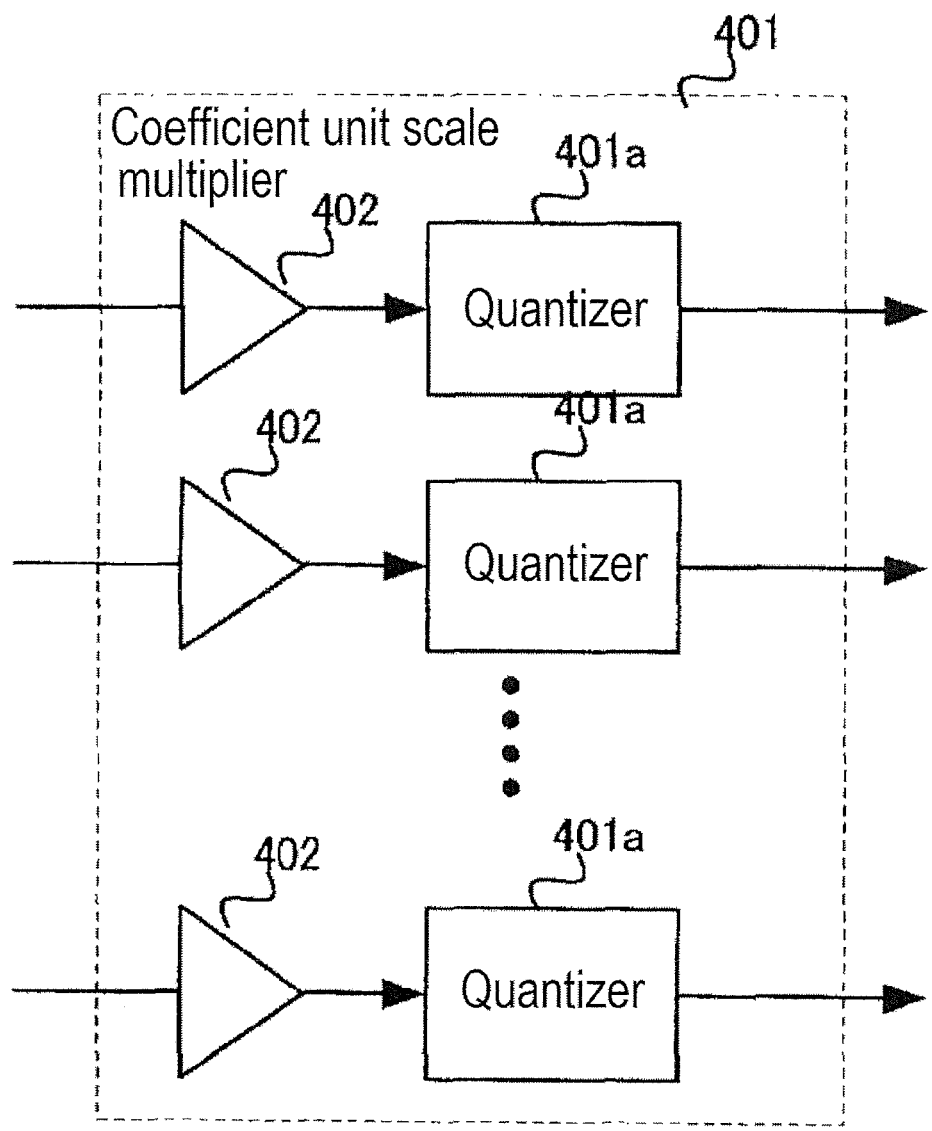
FIG. 13 is an exemplary diagram of a structure of a quantizer arranged with a coefficient unit scale multiplier used in a conversion device related to one embodiment of the present invention.

As the conversion device related to a sixth embodiment of the present invention, a conversion device is explained such that a quantizer of any one of the conversion devices explained thus far has a coefficient unit scale multiplier. A functional block diagram of a qunatizer (401) which can be used in the conversion device related to the sixth embodiment of the present invention is shown in FIG. 13. In the present embodiment, the quantizer (401) is arranged with a coefficient unit scale multiplier (402) for gain adjustment after a vector conversion. The quantizer (401) includes a plurality of internal quantizers (401a) and an output of the coefficient unit scale multiplier (402) is input to each of the internal quantizers (401a). One of the vector signals output by the vector filter is input to the coefficient unit scale multiplier (402).

Gain is produced according to the characteristics of a filter when the vector filters explained in the embodiments thus far are used. The quantizer (401) converts an input signal to a digital signal. At this time, a quantization noise is produced because the number of bits of the quantizer (401) is finite. In addition, the relative effects of the quantization noise vary due to the output amplitude of the vector filter. Furthermore, because an analog-digital conversion device related to the embodiments of the present invention is installed using an electronic circuit such as a usual semiconductor, the signal is expressed using the value of a voltage or a current. In an electronic circuit, there is a maximum value in a voltage or a current. In the case of a voltage, the value cannot exceed the power supply voltage. Therefore, the amplitude of a signal input to the quantizer (401) is within the maximum input range of the quantizer (401) and the amplitude is preferred to be as large as possible.

In the analog-digital conversion device related to the present embodiment, an internal signal is a vector signal and a plurality of signals exists. As a result, in the present embodiment it is possible to set the input range to each internal quantizer (401a) by the coefficient unit scale multiplier (402) in order to satisfy the conditions described above, and it is possible to improve the conversion accuracy of the entire conversion process.

Furthermore, the number of bits of the internal quantizers (401a) can each be set to a different number of bits respectively. In particular, in the embodiments which use a vector converter in a vector filter as described above, each vector element includes different frequency components. Therefore, by increasing the number of bits of a specific quantizer among each of the quantizers (401a) it is possible to reduce the noise component with respect to a frequency which has characteristics to be improved. Alternatively, by reducing the number of bits with respect to frequency components in which performance is not demanded, it is possible to effectively reduce circuit scale of the quantizer. Over sampling is performed in an analog-digital conversion device related to the present embodiment. As a result, the signal component is distributed to a specific frequency. Therefore, by increasing the number of bits of a quantizer which receives this signal component it is possible to control the increase in circuit scale to a minimum and improve the performance.

Figure 14:
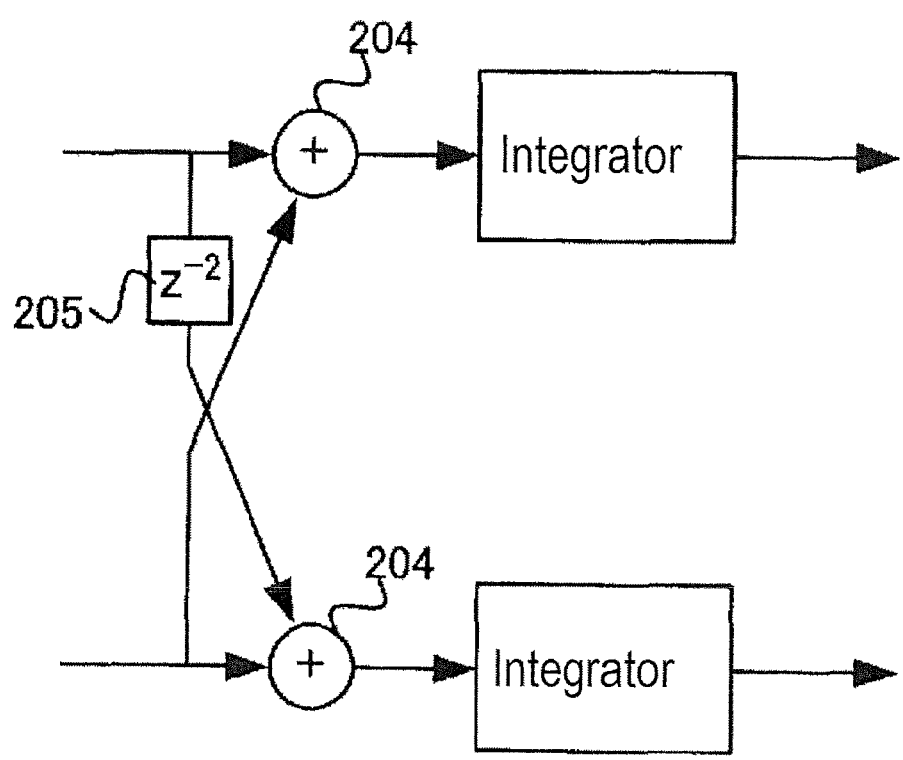
FIG. 14 is an exemplary diagram of a structure of a vector filter using an integrator used in a conversion device related to one embodiment of the present invention.

As a conversion device related to a seventh embodiment of the present invention, a conversion device is explained such that a vector filter has a cross-coupling circuit in any one of the conversion devices explained thus far. A functional block diagram of a vector filter which can be used in a conversion device related to the seventh embodiment of the present invention is shown in FIG. 14. A vector filter used in a conversion device related to the present embodiment is a vector filter having 2 vector elements, for example. A vector filter used in a conversion device related to the present embodiment corresponds to a conventional low pass type $\Delta\Sigma$ modulator which reduces noise at a low frequency band. In the present embodiment, by using a cross-coupling circuit with respect to a vector element in an integrator (303a), in the case where each vector component shows the component for each sampling time of an input signal, it is possible to output a different integration component of 1 sampling time respectively. Here, the number of vector elements is shown as 2, however, the number of elements is not limited to 2 and can be any optional number of elements.

Figure 15:
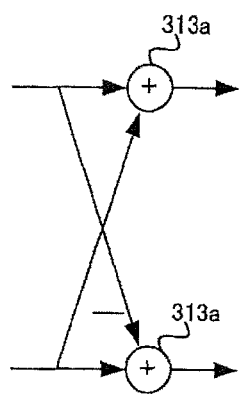
FIG. 15 is an exemplary diagram of a structure of a vector converter used in a conversion device related to one embodiment of the present invention.

As a conversion device related to an eighth embodiment of the present invention a conversion device is explained such that a vector filter which outputs a sum of vector components and/or a difference in vector components is included in any one of the conversion devices explained thus far. A functional block diagram of a vector filter which can be used in a conversion device related to the eighth embodiment of the present invention is shown in FIG. 15. A vector filter which is used in a conversion device related to the present embodiment is a vector filter in the case where the number of vector elements is 2 for example. In the present embodiment, the vector filter realizes the sum and difference of each vector component using an adder (313a, 313b). $x_1+x_2$ is the sum of an input vector signal component output as an output of the adder (313a). It is possible to output a low band component (a high band component is reduced) among the input vector signal components as this sum. Alternatively $x_1-x_2$ is output as the differences between components as the output of the adder (313b). It is possible to output a high band component (a low band component is reduced) among the input vector signal components as this difference.

In this way, it is possible to extract a signal with different frequency components respectively. By increasing or decreasing according to necessity the number of bits of a quantizer arranged after the vector converter described above, it is possible to decrease only the quantized noise in the required frequency components.

Figure 16:
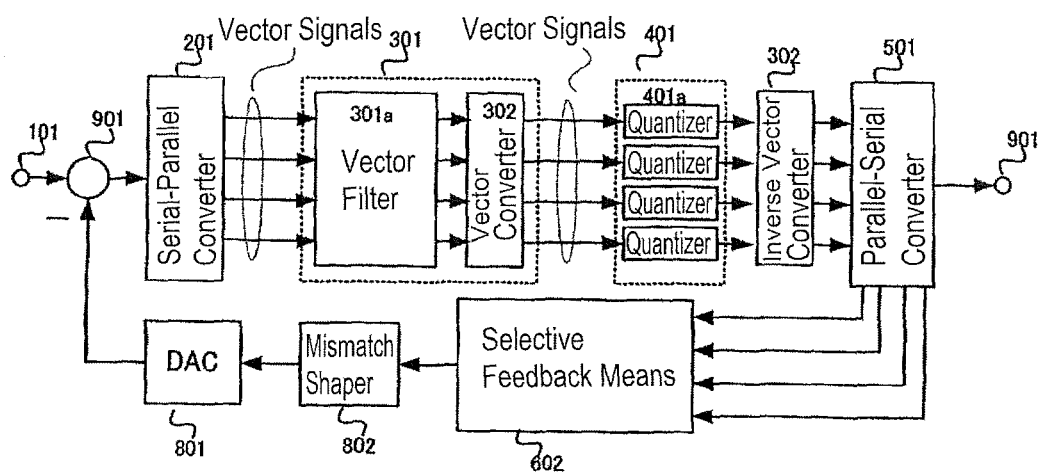
FIG. 16 is a functional block diagram of a conversion device having a selective feedback related to one embodiment of the present invention.

A functional block diagram of a selection device related to a ninth embodiment of the present invention is shown in FIG. 16. A selection device related to the present embodiment has a structure in which any of the conversion devices explained thus far includes a selective feedback means. In the present embodiment, a feedback signal output from a digital-analog converter (801) is subtracted using a subtractor (901) from an input signal input by an input means, the signal is input to a serial-parallel converter (201) and converted to a parallel signal. The converted parallel signal is input to the vector filter (301) and a signal output by the vector filter is quantized by the quantizer (401). The signal which is the quantized result is again converted to a serial signal by the parallel-serial converter (401) and fed back to the input means via the DAC (801) using a selective feedback means (602). A mismatch shaper (302) can be used to reduce the noise produced by variations of the elements which form the DAC (801). In the selective feedback means (602) in this structure, only one part of the signal from the quantizer (401) is selected and it is possible to characterize the selective feedback means as producing a feedback signal.

As described above, it is possible to use a vector converter (302) within the vector filter (301). By using the vector converter (302) it is possible to provide signals mainly including each vector component of the output of the converter, which are different frequency components or time components according the vector converter used. Therefore, by selectively feeding back the frequency component which is to be finally converted, it is possible to convert a required component to a digital signal and it is possible to reduce the circuit scale by not feeding back unnecessary components. The present embodiment can improve a conversion accuracy by converting an input signal to a vector signal. However, when the number of vector elements is M, the circuit scale sometimes increases M times due to a vectorization. Thus, in the present embodiment, by using a selective feedback means it is possible to reduce the circuit scale of a feedback path.

Figure 17:
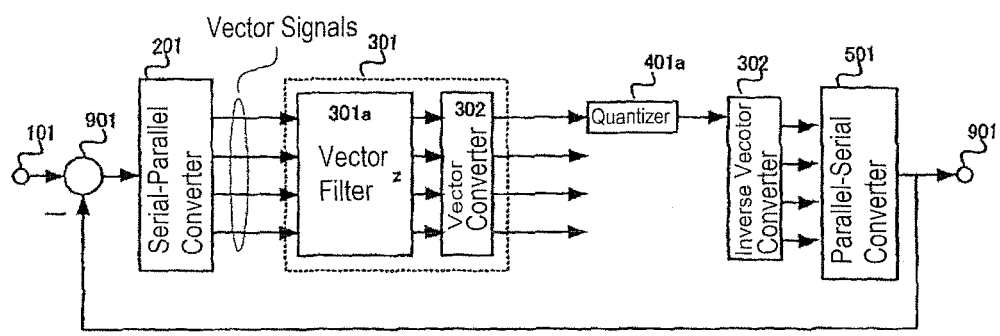
FIG. 17 is a functional block diagram of a conversion device having a selective feedback related to one embodiment of the present invention.

A functional block diagram of a conversion device related to a tenth embodiment of the present invention is shown in FIG. 17. The conversion device related to the present embodiment has a structure in which any one of the conversion devices explained thus far includes a selective feedback means. In FIG. 17, the digital-analog converter (801) and mismatch shaper (302) are omitted for the purposes of simplicity. In the present embodiment, a feedback signal output from the digital-analog converter (801) is subtracted using a subtractor (901) from an input signal input by an input means (101), the signal is input to a serial-parallel converter (201) and converted to a parallel signal. The converted parallel signal is input to the vector filter (301). The signal output by the vector filter (301) is quantized by the quantizer (401) and fed back to the input means. Among the outputs of the vector filter, only the elements which output a signal band component are quantized by the quantizer (401a) and a feedback signal is produced. As a result, it is possible to remove the quantizer (401a) and reduce circuit scale.

Figure 18:
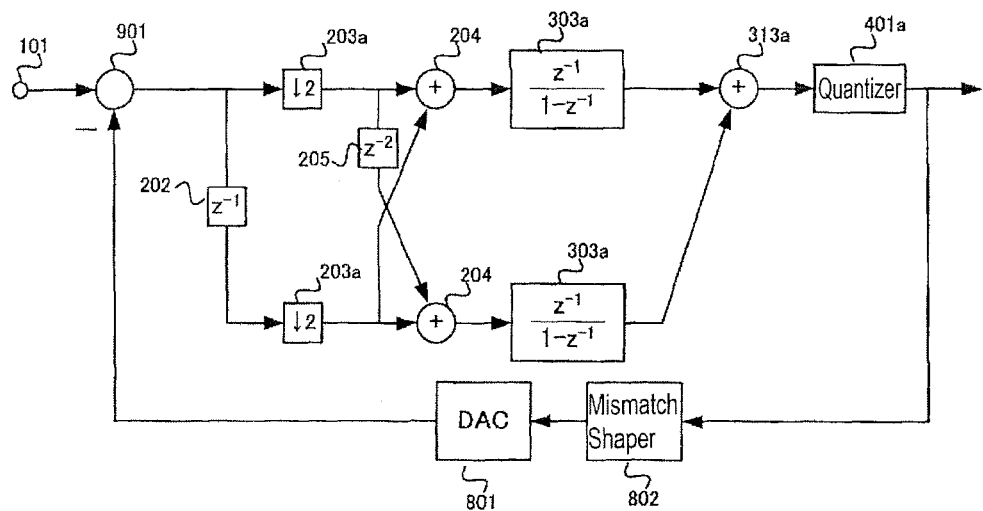
FIG. 18 is a functional block diagram of a conversion device having a selective feedback related to one embodiment of the present invention.

A functional block diagram of a conversion device related to an eleventh embodiment of the present invention is shown in FIG. 18. The conversion device related to the present embodiment has a structure in which in any one of the conversion devices explained thus far, an input signal is converted to a vector signal by a serial-parallel converter comprised from a delay device (202) and a down sampler (203) as is shown in FIG. 18. This vector signal is connected to a vector filter formed by a delay device (205), an adder (204) and an integrator (303a), and a low band component is extracted by a vector converter formed by an adder (313a). Only this signal is converted to a digital signal using the quantizer (401a) and it is possible to feed back the signal to the input stage.

Figure 19:
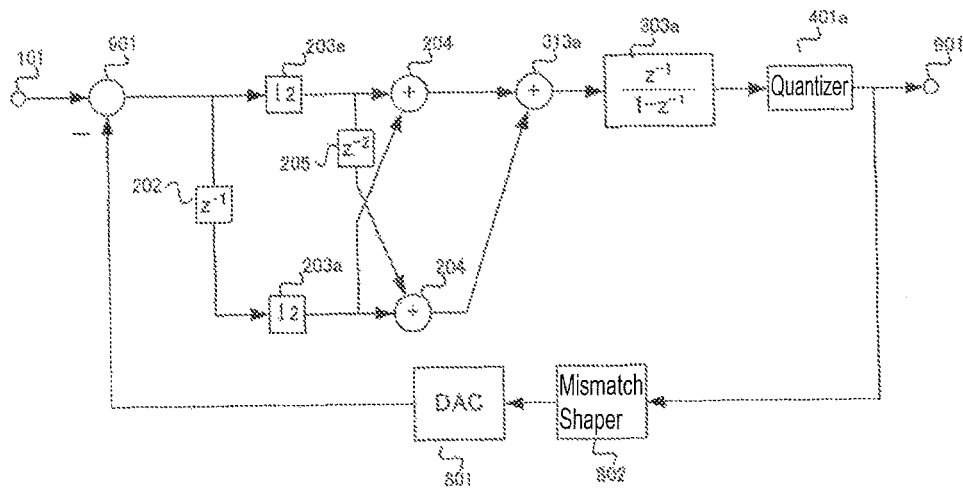
FIG. 19 is a functional block diagram of a conversion device having a selective feedback related to one embodiment of the present invention.

A functional block diagram of the conversion device related to a twelfth embodiment of the present invention is shown in FIG. 19. The structure of the present embodiment corresponds to a structure whereby the structure described in the above embodiment is simplified. In FIG. 19, an input signal is converted to a vector signal by a serial-parallel converter formed by a delay device (202) and a down sampler (203a). The vector signal is input to an integrator (303a) after a low band component is extracted by a vector converter formed by a delay device (205), an adder (204), and an adder (313a). The signal output by the integrator (303a) is converted to a digital signal by a quantizer (401a) and fed back to the input stage.

By adopting this type of structure, it becomes possible to use one integrator instead of two integrators used in the embodiment described above. This can be realized since the order of an integration calculation and a vector conversion described in the embodiments above is reversed. Even if the order of a linear calculation is generally changed, the characteristics in the present embodiment do not change because the calculation does not change. Therefore, it is possible to reduce an integrator and because an integrator has a large circuit scale it becomes possible to reduce current consumption as well as circuit scale.

The case where M is 2 is illustrated in the diagram in the present embodiment when the number of elements of a vector is given as M. However, one integrator is included even in the case where M is increased. In the present embodiment, it is possible to improve conversion speed by converting an input signal to a vector signal. However, circuit scale is sometimes increased M times due to a vectorization. Because it is possible to reduce the number of integrators as described above, it is possible to improve conversion speed M times without increasing circuit scale and while maintaining conversion speed even when M is increased.

Figure 20:
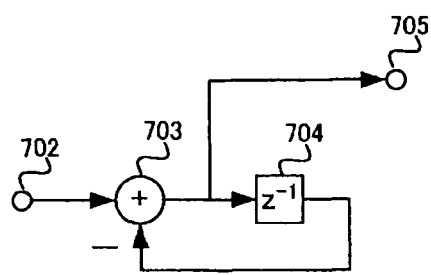
FIG. 20 is an exemplary diagram of a structure of a compensator used in a conversion device related to one embodiment of the present invention.

As a conversion device related to a thirteenth embodiment of the present invention, a conversion device is explained such that a compensator is included in any one of the conversion devices explained thus far. A functional block diagram of a compensator which can be used in a conversion device related to the thirteenth embodiment of the present invention is shown in FIG. 20. In the present embodiment, a compensator is formed by using delay devices as the serial-parallel converter (201) and a parallel-serial converter (401). As a result, the number of delays within in a loop is increased in the case where the number of elements of a vector is increased and a loop stability is sometimes lost. In the present embodiment, an output prediction is performed using the method explained below in order to reduce the effects of this delay. In this way, it is possible to obtain an output in the case where there is no delay device and obtain a loop stability. Generally, it is possible to express a linear system having a feedback path as follows.

$$x(k)=Ax(k-1)+bu(k-1)$$

$$u(k)=fx(k)=fAx(k-1)+fbu(k-1)$$

Here, x represents a state variable, u represents an input signal, A represents a system matrix, b represents a coefficient matrix with respect to an input and f represents a feedback matrix. Therefore, by calculating u shown in the equations and using as a feedback signal it is possible to achieve a stable loop. In the example shown in FIG. 20, a formation method of a compensator is shown in the case where an integrator is of a single stage.

Figure 21:
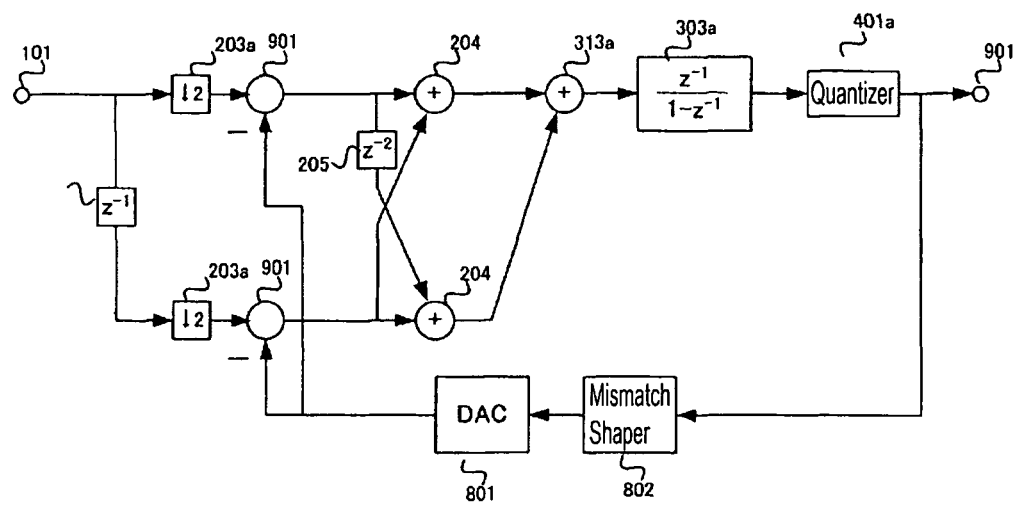
FIG. 21 is a functional block diagram of a conversion device having a selective feedback related to one embodiment of the present invention.

A functional block diagram of a conversion device related to a fourteenth embodiment of the present invention is shown in FIG. 21. The structure of a conversion device related to the present embodiment corresponds to a structure whereby the structure described by the thirteenth embodiment is simplified. In FIG. 21, an input signal is converted to a vector signal by a serial-parallel converter. In the present embodiment, the serial-parallel converter is formed by a delay device (202) and a down sampler (203a). A low band component is extracted by a vector converter from the vector signal output by the serial-parallel converter. In the present embodiment, a vector converter is formed by a delay device (205), an adder (204), and an adder (313a). A signal of a low band component extracted by this type of vector converter is input to an integrator (303a). The output of the integrator (303a) is converted to a digital signal by a quantizer (401a) and fed back to the input stage. In the present embodiment, a feedback signal is input after the serial-parallel converter and a calculation of the feedback signal and the input signal is performed within a slow sampling speed after down sampling. In this way, it is possible to reduce circuit operation speed, improve the accuracy and reduce the current consumption.

Figure 22:
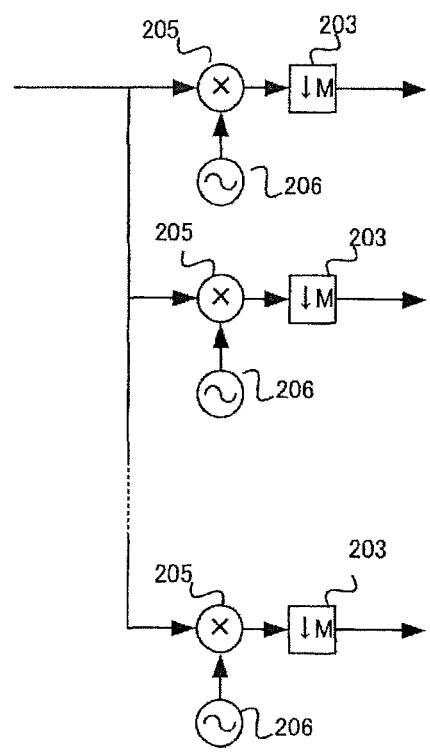
FIG. 22 is an exemplary diagram of a structure of a serial parallel converter used in a conversion device related to one embodiment of the present invention.

As the conversion device related to a fifteenth embodiment of the present invention, a conversion device is explained such that a serial-parallel device includes a mixer means in any one of the conversion devices explained thus far. A functional block diagram of a serial-parallel converter which can be used in a conversion device related to the fifteenth embodiment of the present invention is shown in FIG. 22. An input signal is multiplied by a signal from local oscillators (206a, 206b, 206m) in a mixer means (205). A multiplied signal output from the mixer means (205) is sampled by a down sampler (203). Here, signals having equal frequencies and different phases are used in each of the local oscillators. In particular, in the case where the degree of parallels is given as M, and by selecting so that each phase becomes $2\pi/M$, it is possible to accurately convert the components of an input signal.

Figure 23:
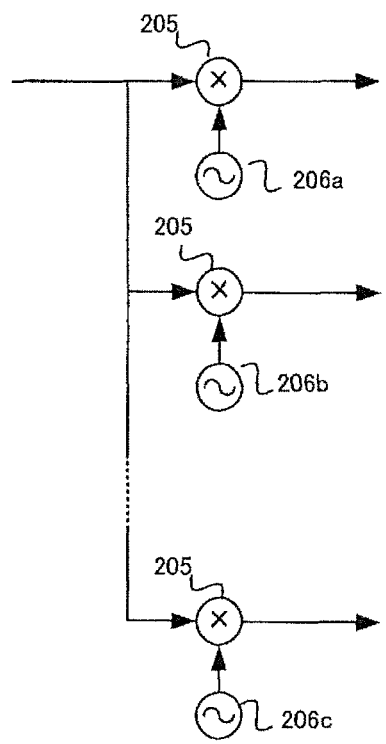
FIG. 23 is an exemplary diagram of a structure of a parallel serial converter used in a conversion device related to one embodiment of the present invention.

As a conversion device related to a sixteenth embodiment of the present invention, a conversion device is explained such that a serial-parallel device includes a plurality of mixer means and an input signal is multiplied by a signal in which phase differences mutually equals to $2\pi$ divided by an integer in any one of the conversion devices explained thus far. A functional block diagram of a serial-parallel converter which can be used in the conversion device related to the sixteenth embodiment of the present invention is shown in FIG. 23. An input signal is multiplied by a signal from local oscillators (206a, 206b, 206m) in a mixer means (205). Here, signals having an equal frequency and different phases are used in each of the local oscillators. In particular, in the case where the degree of parallels is given as M, a selection is performed so that each phase becomes $2\pi/M$. In other words, the difference of two signals multiplied in each mixer means (205) becomes a multiple of $2\pi$ divided by an integer. In this way, it is possible to accurately convert the components of an input signal. Here, a signal is connected to a next stage vector filter without sampling. At this time, a continuous-time circuit is used as the vector filter. By adopting this type of structure, sampling is performed by a quantizer. By providing a large benefit to a vector filter, it is possible to reduce a folding noise produced by a quantizer using the feedback effects by the benefit of the feedback. As a result, the effects of folding noise are reduced, it is possible to relax the demands on a folding noise reduction filter in the analog-digital conversion device of the present invention and a folding noise reduction filter becomes unnecessary.

In addition, in the embodiments shown in FIG. 22 and FIG. 23 it is possible to use a Hadamard signal or a wavelet signal other than a sine wave as a signal of the local oscillators.

Figure 24:
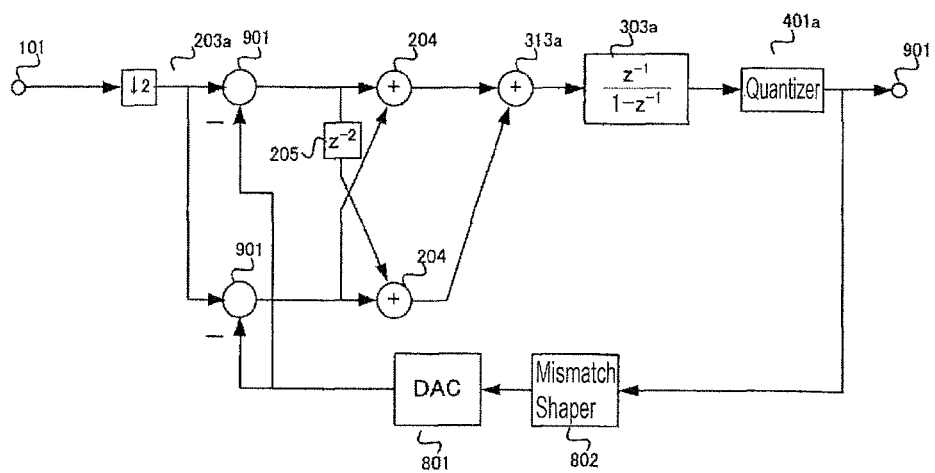
FIG. 24 is a functional block diagram of a conversion device related to one embodiment of the present invention.

A functional block diagram of a conversion device related to a seventeenth embodiment of the present invention is shown in FIG. 24. The structure of a conversion device related to the present embodiment corresponds to a structure whereby the structure described by the fourteenth embodiment is simplified. In FIG. 24, an input signal is converted to a vector signal after being down sampled by a down sampler (203a). In the present embodiment a serial-parallel converter is formed by the down sampler (203a). A low band component is extracted from the vector signal output from the serial-parallel converter by a vector converter. In the present embodiment, the vector converter is formed by a delay device (205), an adder (204), and an adder (313a). The signal of the low band component extracted using this type of vector converter is input to an integrator (303a). The output of the integrator (303a) is converted to a digital signal by a quantizer (401a) and output. In addition, the output which is converted to a digital signal by the quantizer (401a) is fed back to the input stage. At this time, it is possible to input the output converted to a digital signal by the quantizer (401a) to a mismatch shaper (802) and DAC (801) as is shown in FIG. 24 and to feedback the output to the input means.

In the present embodiment, the serial-parallel converter is formed by using the same signal after an input signal is down sampled. In an over sampling type converter, because the bandwidth of an input signal is sufficiently lower than a normal sampling frequency, the effect is small when adopting the structure of the present embodiment. In this way, sampling may be performed at a post down sampling frequency and it is possible to easily form a circuit. In addition, the delay element becomes unnecessary and it is possible to reduce circuit scale.

Figure 25:
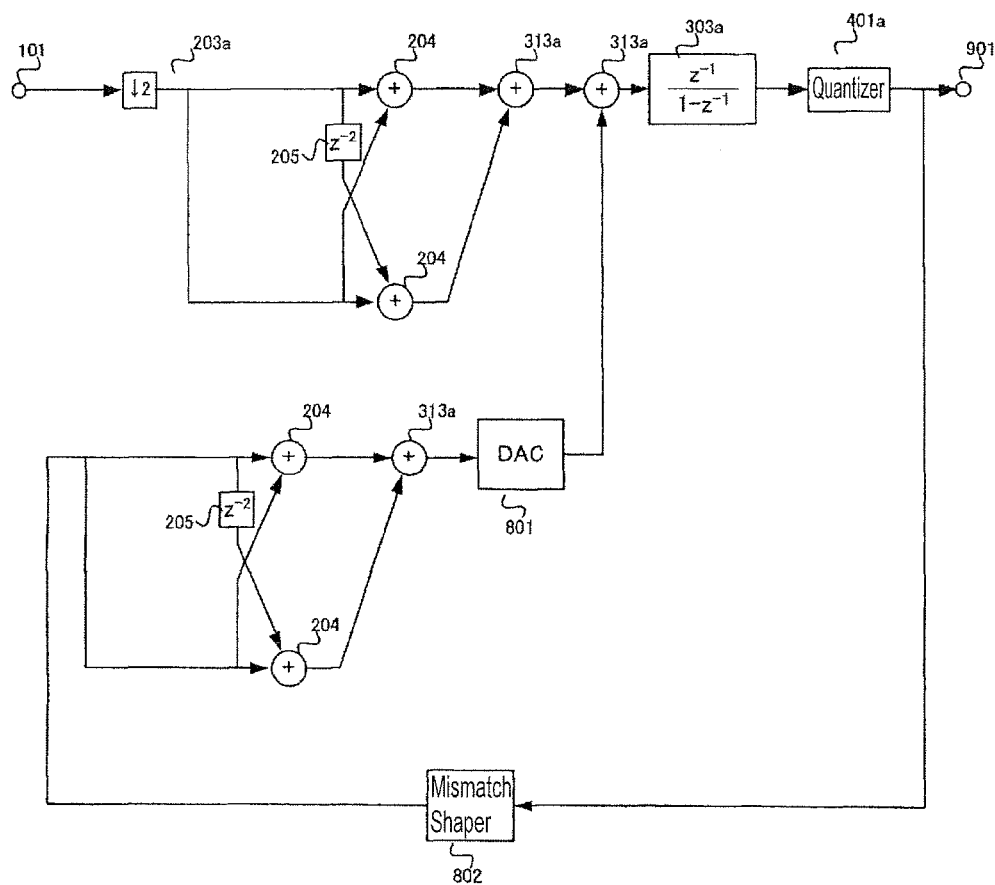
FIG. 25 is a functional block diagram of a conversion device related to one embodiment of the present invention.

A functional block diagram of a conversion device related to an eighteenth embodiment of the present invention is shown in FIG. 25. The structure of a conversion device related to the present embodiment corresponds to a structure whereby the structure of a feedback path in the structure of the seventeenth embodiment is digitally processed. In FIG. 25 an input signal is converted to a vector signal after being down sampled by a down sampler (203a). A low band component is extracted from the vector signal output from the serial-parallel converter by a vector converter. In the present embodiment, the vector converter is formed by a delay device (205), an adder (204), and an adder (313a). The signal of the low band component extracted using this type of vector converter is input to an integrator (303a). The output of the integrator (303a) is converted to a digital signal by a quantizer (401a) and fed back to the input stage.

In the present embodiment, a vector conversion of a signal from a feedback path is formed by a digital circuit. By adopting this structure, it is possible to form vector conversion easily and with a high level of accuracy. A vector filter can be formed by a switched capacitor circuit (an SC circuit). In the case of using an SC circuit, a signal from an input path and a signal from a feedback path are usually formed by different SC circuits. In the present embodiment, it is possible to adopt a structure where an SC circuit which is an analog circuit is used only in an input path, and to reduce analog circuits and to improve accuracy.

Figure 26:
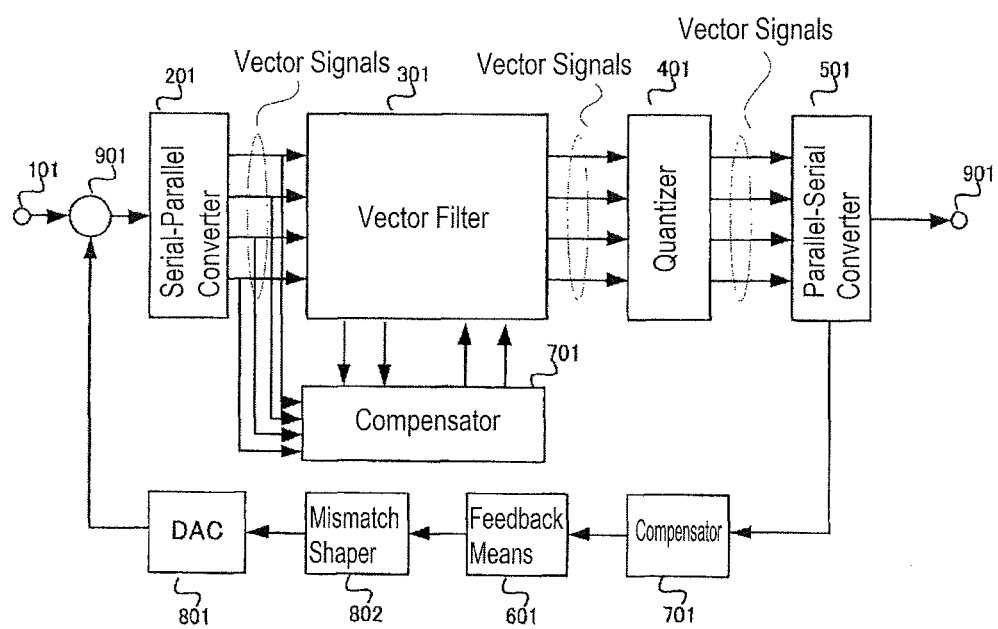
FIG. 26 is a functional block diagram of a conversion device related to one embodiment of the present invention.

A functional block diagram of a conversion device related to a nineteenth embodiment of the present invention is shown in FIG. 26. A feedback signal from a digital-analog converter (DAC) (801) is subtracted using a subtractor (901) from an input signal input by an input means (101). The subtracted signal is input to a serial parallel converter (201). In other words, the subtractor (901) is arranged before the serial parallel converter (201). The parallel signal which is converted by the serial parallel converter (201) is input to a vector filter (301). The signal which is processed by the vector filter (301) is quantized by a quantizer (401). The quantized signal is again converted to a serial signal by a parallel serial converter (401). In addition, the signal is fed back to the input means (101) via a DAC (801) by a feedback means (601).

The present embodiment corresponds to a structure whereby the compensator (701) in the first embodiment is arranged with a vector filter in parallel or in series. In the case where an internal signal is vectorized, stability of a closed loop sometimes decreases due to the effects of a serial-parallel converter and a parallel serial converter or effects of a delay device in a vector filter. A compensator is inserted in order to reduce these effects and may be arranged within the loop. In the present embodiment, by connecting a compensator to a vector filter it is possible to form a compensator using an internal signal within the vector filter. In this way, it becomes possible to easily form the compensator shown in the thirteenth embodiment and improve stability of the loop. In addition, in the present embodiment, it is also possible to omit a part or all of the quantizers as in the tenth embodiment shown in FIG. 17.

Figure 27:
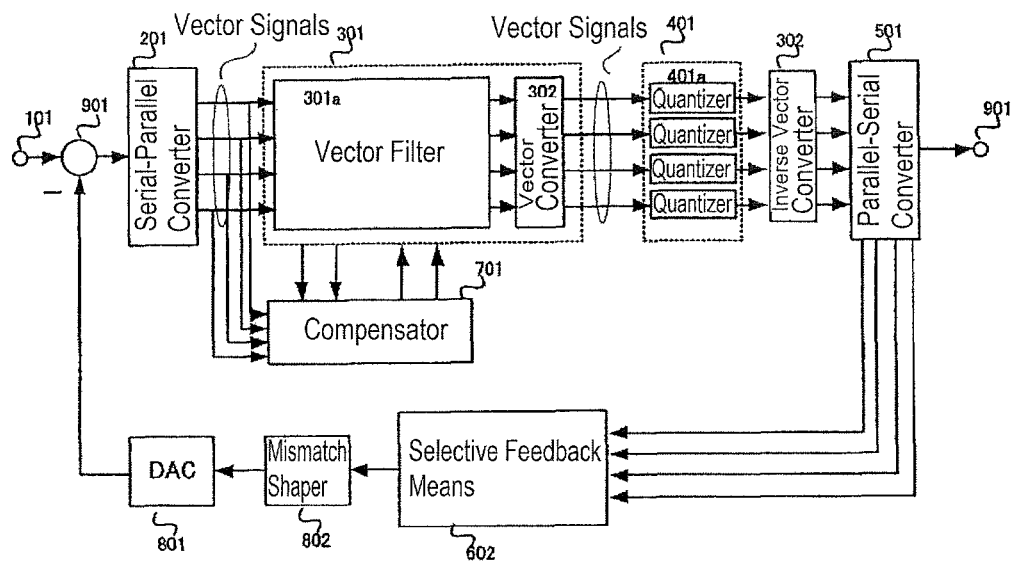
FIG. 27 is a functional block diagram of a conversion device related to one embodiment of the present invention.

A functional block diagram of a conversion device related to a twentieth embodiment of the present invention is shown in FIG. 27. The present embodiment corresponds to a structure whereby the compensator (701) in the ninth embodiment is inserted within a feedback loop. As explained in the nineteenth embodiment, stability of a closed loop sometimes decreases in the case where a signal is vectorized. The compensator is inserted in order to reduce this effect and may be arranged within the loop. In the present embodiment, by connecting the compensator to a vector filter it is possible to form the compensator using an internal signal within the vector filter. In this way, it is possible to easily form the compensator shown in the thirteenth embodiment and improve loop stability. In addition, although the compensator is connected to the vector filter in the diagram it may also be arranged within the loop. For example, the compensator may also be arranged on the feedback path as is shown in FIG. 3.

Figure 28:
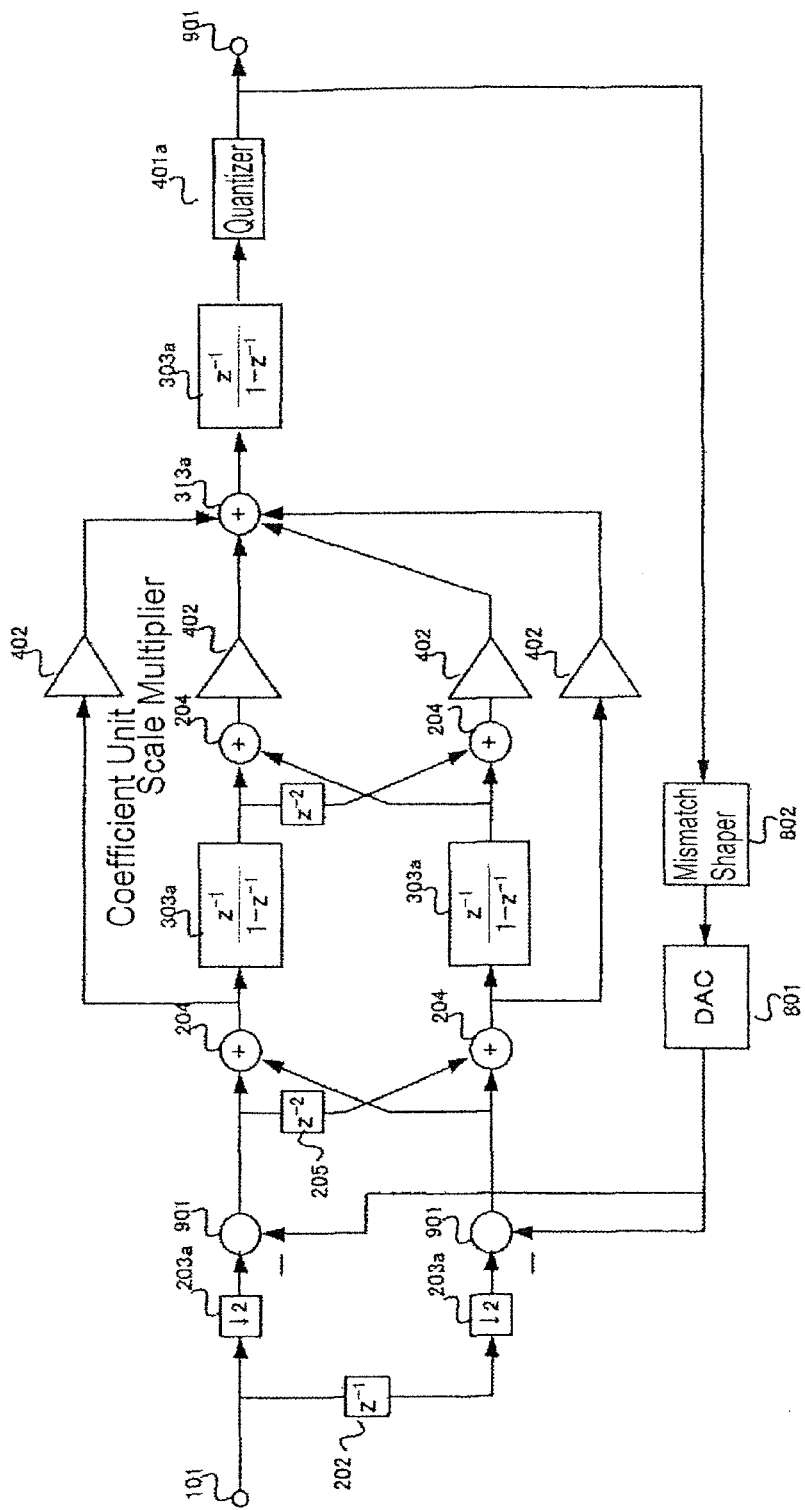
FIG. 28 is a functional block diagram of a conversion device related to one embodiment of the present invention.

A functional block diagram of a conversion device related to a twenty-first embodiment of the present invention is shown in FIG. 28. The conversion device related to the present embodiment has a structure whereby an input signal is converted to a vector signal by a serial-parallel converter formed by a delay device (202) and down sampler (203) as is shown in FIG. 21 in any of the conversion devices explained thus far. The vector signal is connected to a delay device (205), an adder (204), and an adder (313a); and the low band component is extracted using the vector converter formed by the adder (313a). It is possible to convert only this signal to a digital signal by the quantizer (401a) and to feed the signal back to the input stage. In addition, it is possible to form the compensator by a coefficient unit scale multiplier (402) and the adder (313a) and thereby it is possible to improve a stability of the loop.

In the present embodiment, it is possible to improve the overall benefits of a loop filter by connecting integrators in two stages in series and to reduce quantization noise in an output. In addition, it is possible to form the second stage integrator with one integrator and reduce circuit scale. In the present embodiment, it is possible to arrange the vector converter before the first stage integrator as is shown in FIG. 19 and in this case it is possible to form the first stage integrator using one integrator.

Figure 29:
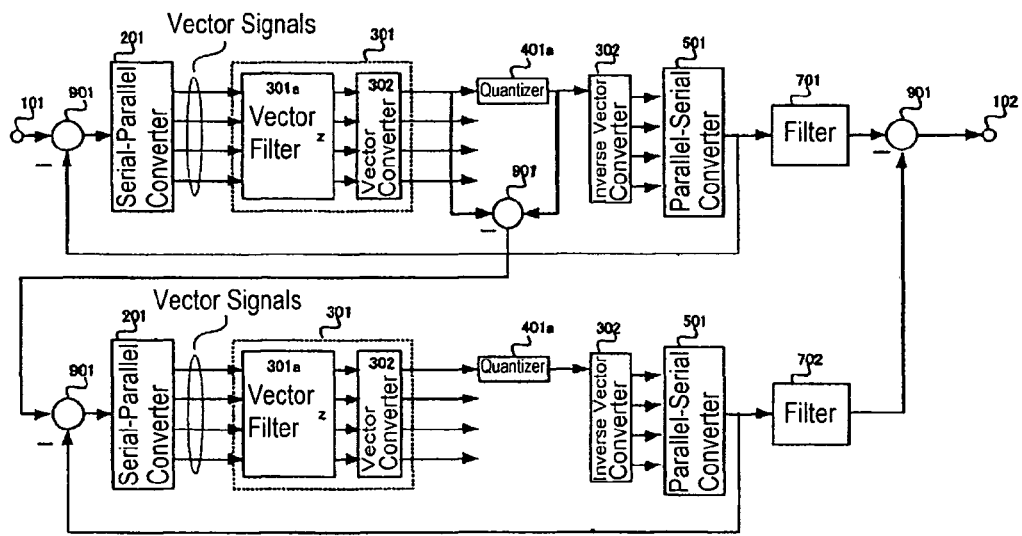
FIG. 29 is a functional block diagram of a conversion device related to one embodiment of the present invention.

A functional block diagram of a conversion device related to the twenty-second embodiment of the present invention is shown in FIG. 29. The present embodiment uses a plurality of converters related to the tenth embodiment shown in FIG. 17, and by using a second converter to convert quantized noise produced by a quantizer of the first converter and subtract a second output from the first converter using a subtractor (901) it becomes possible to subtract the quantization noise of the first converter. At this time, a transfer function of a filter means (701) is given as a transfer function of the second converter and a transfer function of a filter means (702) is equal to a noise transfer function of the first converter, thereby the noise transfer function up to the output from the quantized noise of the second converter can be given as multiplying the quantization noise of the second converter by the quantization noise of the first converter. Here, while the converters are connected in two stage in serial, it is possible to connect the converters in three stages or more and increase the order of the noise transfer function by increasing the number of stages. In addition, while a plurality of tenth embodiments are connected for the purposes of explanation it is also possible to obtain the same effects by connecting a plurality of other embodiments.

What is claimed is:

1. A conversion device which converts an analog input signal to a digital signal and outputs the digital signal, the conversion device comprising:

a feedback signal generator which performs digital-analog conversion after mismatch shaping the digital signal, which is converted and output by the conversion device, and generates a feedback signal;

a subtractor which subtracts the feedback signal from the analog signal and outputs the analog signal, which is subtracted;

a serial-parallel converter which converts a signal output from the subtractor to a plurality of parallel signals and outputs the plurality of parallel signals;

a vector filter which performs signal processing on the plurality of parallel signals, which are output from the serial-parallel converter, and outputs the plurality of parallel signals;

a vector converter which performs vector conversion on the plurality of signals, which are output by the vector filter, and outputs the plurality of signals;

a quantizer which quantizes the plurality of signals, which is output from the vector filter, and outputs a digital signal;

a reverse vector converter which performs a reverse conversion of the vector conversion performed by the vector converter on the digital signal, which is output by the quantizer, and outputs a digital signal, which is converted; and a parallel-serial converter which converts the converted digital signal, which is output by the reverse vector converter, to a serial signal and outputs the serial signal.

2. The conversion device according to claim 1, wherein the quantizer quantizes a part of the plurality of signals, which is output by the vector converter, and outputs the digital signal.

3. A conversion device which converts an analog input signal to a digital signal and outputs the digital signal, the conversion device comprising:

a feedback signal generator which performs digital-analog conversion after mismatch shaping the digital signal which is converted and output by the conversion device, and generates a feedback signal;

a subtractor which subtracts the feedback signal from the analog signal and outputs the analog signal, which is subtracted;

a serial-parallel converter which inputs a signal, which is output from the subtractor, to a circuit in which a plurality of delay circuits are connected in series, down samples the analog input signal and each output signal of the plurality of delay circuits to convert to a plurality of parallel signals and outputs the plurality of parallel signals;

a vector filter which performs signal processing on the plurality of parallel signals, which are output from the serial-parallel converter, and outputs a plurality of signals;

a vector converter which inputs the plurality of parallel signals, which are output by the serial-parallel converter, to a cross-coupling circuit, inputs an output of the cross-coupling circuit to an integrator, and outputs a sum of an output of the integrator; and a quantizer which quantizes a signal output from the vector converter and outputs the digital signal.

4. A conversion device which converts an analog signal to a digital signal and outputs the digital signal comprising:

a feedback signal generator which performs digital-analog conversion after mismatch shaping the digital signal, which is converted and output by the conversion device, and generates a feedback signal;

a subtractor which subtracts the feedback signal from the analog input signal and outputs the analog input signal, which is subtracted;

a serial-parallel converter which inputs a signal, which is output from the subtractor, to a circuit in which a plurality of delay circuits are connected in series, down samples each output signal from the plurality of delay circuits to convert to a plurality of parallel signals and outputs the plurality of parallel signals;

a vector filter which performs signal processing on the plurality of parallel signals, which are output from the serial-parallel converter, and outputs a plurality of signals;

a vector converter which inputs the plurality of parallel signals, which are output by the serial-parallel converter, to a cross-coupling circuit, inputs a sum of outputs of the cross-coupling circuit to an integrator, and outputs an output of the integrator; and a quantizer which quantizes a signal, which is output from the vector converter, and outputs the digital signal.

* * * * *